(12) United States Patent
Yamauchi

(10) Patent No.: US 8,099,866 B2
(45) Date of Patent: Jan. 24, 2012

(54) CONDUCTOR-CLAD LAMINATE, WIRING CIRCUIT BOARD, AND PROCESSES FOR PRODUCING THE SAME

(75) Inventor: Daisuke Yamauchi, Ibaraki (JP)

(73) Assignee: Nitto Denko Corporation, Ibaraki-Shi (JP)

( * ) Notice: Subject to any disclaimer, the term of this patent is extended or adjusted under 35 U.S.C. 154(b) by 791 days.

(21) Appl. No.: 11/603,048

(22) Filed: Nov. 22, 2006

(65) Prior Publication Data

US 2007/0113961 A1    May 24, 2007

(30) Foreign Application Priority Data

Nov. 24, 2005  (JP) ............................. P.2005-337993

(51) Int. Cl.
    *H05K 3/10* (2006.01)
(52) U.S. Cl. ............... 29/846; 29/825; 29/831; 29/458; 29/527.1; 156/233; 156/235; 156/238; 156/289
(58) Field of Classification Search .................... 29/458, 29/527.1, 527.2, 423, 424, 557, 558, 825, 29/846, 851, 831; 156/233, 235, 238, 289
    See application file for complete search history.

(56) References Cited

U.S. PATENT DOCUMENTS

| | | | | |
|---|---|---|---|---|
| 6,197,407 B1 * | 3/2001 | Andou et al. | ................. | 428/209 |
| 6,807,729 B2 * | 10/2004 | Kawashima et al. | ............ | 29/831 |
| 2001/0056174 A1 * | 12/2001 | Okada et al. | ................. | 528/310 |
| 2004/0260009 A1 | 12/2004 | Tosaki et al. | | |

FOREIGN PATENT DOCUMENTS

| | | | |
|---|---|---|---|
| CN | 1392764 A | | 1/2003 |
| JP | 55-42839 A | | 3/1980 |
| JP | 55042839 A | * | 3/1980 |
| JP | 08-167775 | | 6/1996 |
| JP | 10-126035 A | | 5/1998 |
| JP | 10-296907 A | | 11/1998 |
| JP | 10296907 A | * | 11/1998 |
| TW | 200504170 A | | 2/2005 |
| TW | 200522807 A | | 7/2005 |

OTHER PUBLICATIONS

Japanese Office Action issued in Application No. 2005-337993, dated Apr. 20, 2010.
Chinese Office Action dated Mar. 6, 2009.
Korean Office Action issued in Application No. 10-2006-116245, dated May 25, 2010.

(Continued)

*Primary Examiner* — Derris Banks
*Assistant Examiner* — Azm Parvez
(74) *Attorney, Agent, or Firm* — Sughrue Mion, PLLC

(57) ABSTRACT

In a roll-to-roll step, an adhesive solution is applied to a release film 1 including a polyethylene terephthalate film and this film 1 is passed through a drying oven 500 regulated to 60 to 150° C. to thereby form an adhesive layer 2. Subsequently, an insulating film 3 including a polyimide film is laminated on the adhesive layer 2 at room temperature (about 25° C.) to thereby produce a layered product 6 including the release film 1, adhesive layer 2 and insulating film 3. Next, the release film 1 is stripped from the layered product 6 and a conductor film 4 including a copper foil is laminated to the adhesive layer 2 to thereby produce a conductor-clad laminate 8.

9 Claims, 6 Drawing Sheets

OTHER PUBLICATIONS

Korean Office Action issued on Nov. 22, 2010 in the corresponding Korean Patent Application No. 10-2006-0116245.
Chinese Office Action, issued Dec. 14, 2010, issued in Application No. 200610162835.2.
Korean Office Action dated Feb. 8, 2011.
Taiwanese Office Action issued in Application No. 095143264 dated Jul. 26, 2011.

* cited by examiner

CONDUCTOR-CLAD LAMINATE, WIRING CIRCUIT BOARD, AND PROCESSES FOR PRODUCING THE SAME

FIELD OF THE INVENTION

The present invention relates to a conductor-clad laminate having a multilayer structure including a conductor film and an insulating film, a wiring circuit board including the laminate, and processes for producing the same.

BACKGROUND OF THE INVENTION

A copper-clad laminate includes a copper foil and a polyimide film superposed thereon. A wiring circuit board is produced by processing the copper foil of the copper-clad laminate into a given wiring pattern by etching.

Such a copper-clad laminate has been conventionally produced by directly applying an adhesive solution to a polyimide film, drying the adhesive solution by heating to form an adhesive layer, and subsequent laminating a copper foil to the polyimide film through the adhesive layer (see, for example, patent document 1).

Patent Document 1: JP-A-10-126035

SUMMARY OF THE INVENTION

In general, a copper-clad laminate is produced while conveying a continuous polyimide film in roll-to-roll steps. Therefore, a given tension in the lengthwise direction is imposed on the polyimide film during the conveyance.

Consequently, when the adhesive solution on the polyimide film is dried, the polyimide film is heated in a tensioned state. The polyimide film is cooled in the tensioned state and then wound into a roll. As a result, the polyimide film comes to have a residual stress therein.

When the copper foil on the polyimide film in such a state is processed into a given wiring pattern by etching, the residual stress in the polyimide film is released. This may cause the polyimide film to change dimensionally. Such a dimensional change of the polyimide film causes a dimensional failure in wiring circuit boards.

An object of the invention is to provide a conductor-clad laminate in which the dimensional change of conductor film during patterning is reduced; and a process for producing the same.

Another object of the invention is to provide a wiring circuit board having a wiring pattern with improved dimensional accuracy; and a process for producing the same.

(1) The invention provides a process for producing a conductor-clad laminate, which comprises: forming an adhesive layer on a release film to thereby produce a first layered product comprising the release film and the adhesive layer; laminating an insulating film on the adhesive layer of the first layered product to thereby produce a second layered product comprising the insulating film, the adhesive layer and the release film; removing the release film from the second layered product to thereby produce a third layered product comprising the insulating film and the adhesive layer; and laminating a conductor film on the adhesive layer of the third layered product.

According to the process for producing a conductor-clad laminate of the invention, an adhesive layer is formed on a release film, whereby a first layered product including the release film and the adhesive layer is produced. In this case, the release film has a residual stress therein after the formation of the adhesive layer.

Subsequently, an insulating film is laminated on the adhesive layer of the first layered product. Accordingly, a second layered product including the insulating film, the adhesive layer and the release film is produced. In this case, since the insulating film is laminated on the adhesive layer which has been formed, the insulating film has almost no residual stress therein.

Furthermore, the release film is removed from the second layered product. Accordingly, a third layered product including the insulating film and the adhesive layer is produced. In this case, since the release film having a residual stress therein is removed, the third layered product has almost no residual stress therein. Thereafter, a conductor film is laminated on the adhesive layer of the third layered product.

As described above, according to the procedure including forming an adhesive layer on a release film; laminating an insulating film on the adhesive layer; removing the release film; and subsequent laminating a conductor film on the adhesive layer, the insulating film has almost no residual stress therein. Consequently, the dimensional change of insulating film due to the release of a residual stress during the patterning of the conductor film of a conductor-clad laminate is reduced.

(2) The step of producing the first layered product may comprise: applying an adhesive solution to a continuous release film while conveying the continuous release film; and drying the adhesive solution by heating while conveying the continuous release film to which the adhesive solution has been applied, to thereby form the adhesive layer on the continuous release film and produce the first layered product in a continuous form.

In this case, an adhesive solution is applied to a continuous release film while the continuous release film is conveyed. The adhesive solution is dried by heating while the continuous release film to which the adhesive solution is applied is conveyed, to thereby form an adhesive layer on the continuous release film.

When the adhesive solution is dried, the continuous release film is heated in a tensioned state and cooled in a tensioned state. Therefore, the release film comes to have a residual stress therein. However, since the release film is removed in the later step, the insulating film to be laminated in the later step comes to have almost no residual stress therein.

(3) The step of producing the second layered product may comprise laminating the continuous insulating film on the adhesive layer of the first layered product in a continuous form while conveying the first layered product and conveying the continuous insulating film, to thereby produce the second layered product in a continuous form, which comprises the continuous insulating film, the adhesive layer and the continuous release film.

In this case, a continuous insulating film is laminated to the adhesive layer of the first layered product in a continuous form while the first layered product in a continuous form is conveyed and the continuous insulating film is conveyed.

In this case, since the continuous insulating film is laminated on the adhesive layer which has been formed, almost no residual stress generates in the continuous insulating film.

(4) The step of producing the third layered product may comprise removing the continuous release film from the second layered product in a continuous form while conveying the second layered product, to thereby produce the third layered product in a continuous form, which comprises the continuous insulating film and the adhesive layer.

In this case, the continuous release film is removed from the second layered product in a continuous form while conveying the second layered product in a continuous form.

Since the release film having a residual stress therein is thus removed, the third layered product has almost no residual stress therein.

(5) The step of laminating a conductor film on the adhesive layer may comprise laminating the continuous conductor film on the adhesive layer of the third layered product in a continuous form while conveying the third layered product.

In this case, a continuous conductor film is laminated to the adhesive layer of the third layered product while the third layered product is conveyed. Since the third layered product in this step has almost no residual stress therein, the dimensional change of the insulating film due to the release of a residual stress during patterning of conductor film is reduced.

(6) The insulating film may comprise a polyimide. Accordingly, flexibility and insulating properties of the insulating film can be secured.

(7) The release film may comprise polyethylene terephthalate. Accordingly, the release film can be easily removed from the adhesive layer.

(8) The adhesive layer may comprise an acrylic adhesive. Accordingly, high adhesion between the insulating film and the conductor film can be secured.

(9) The conductor film may comprise a copper foil. Accordingly, the conductivity becomes high and patterning by etching becomes easy.

(10) The invention further provides a process for producing a wiring circuit board which comprises: producing a conductor-clad laminate by the process according to (1) above; and etching the conductor film of the conductor-clad laminate to thereby form a wiring pattern.

According to the process for wiring circuit board production of the invention, the dimensional change of the insulating film due to the release of residual stress during the patterning of the conductor film of the conductor-clad laminate is reduced. Accordingly, the wiring pattern of the wiring circuit board has improved dimensional accuracy.

(11) The invention furthermore provides a conductor-clad laminate produced by the process according to (1) above.

In the conductor-clad laminate of the invention, the insulating film has almost no residual stress therein. Consequently, the dimensional change of the insulating film due to the release of residual stress during the patterning of the conductor film of the conductor-clad laminate is reduced.

(12) The invention still further provides a wiring circuit board produced by the process according (10) above.

In the wiring circuit board of the invention, the wiring pattern can have improved dimensional accuracy because the insulating film underwent a reduced dimensional change with residual-stress relief in the patterning of the conductor film of the conductor-clad laminate.

According to the invention, since the dimensional change of the insulating film due to the release of residual stress during the patterning of the conductor film of the conductor-clad laminate is reduced, the wiring pattern of the wiring circuit board has improved dimensional accuracy.

Figure 1:
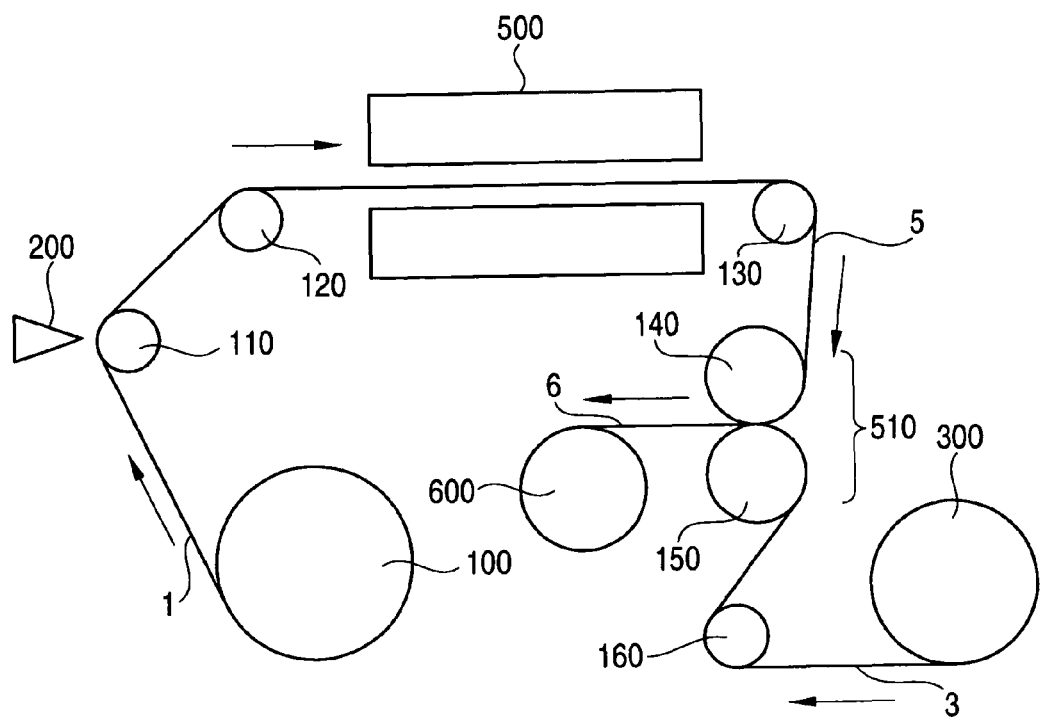
FIG. 1 is a diagrammatic view illustrating a roll-to-roll apparatus for use in producing one embodiment of the conductor-clad laminate of the invention.

DESCRIPTION OF REFERENCE NUMERALS 1 release film
2 adhesive layer
3 insulating film
4 conductor film
5, 6 and 7 layered product
8 conductor-clad laminate
9 etching resist film
10 wiring circuit board
40 conductor pattern
50 layered product
60 layered product
70 layered product
80 conductor-clad laminate
90 resist pattern
100 roll for release film
101 roll for release film
110, 120, 130 and 160 conveying roller
140 and 150 laminating roller
200 adhesive application part
210 roller for stripping
220, 230 and 260 conveying roller
240 and 250 laminating roller
260 conveying roller
300 roll for insulating film
400 roll for conductor film
500 drying oven
510 and 520 laminator
600 roll for layered product
610 roll
800 roll for conductor-clad laminate

DETAILED DESCRIPTION OF THE INVENTION

The process for producing the conductor-clad laminate according to the invention and the process for producing the wiring circuit board production including the same will be explained below. The conductor-clad laminate according to the invention is produced through roll-to-roll steps.

(1) Roll-to-Roll Apparatus

Figure 2:
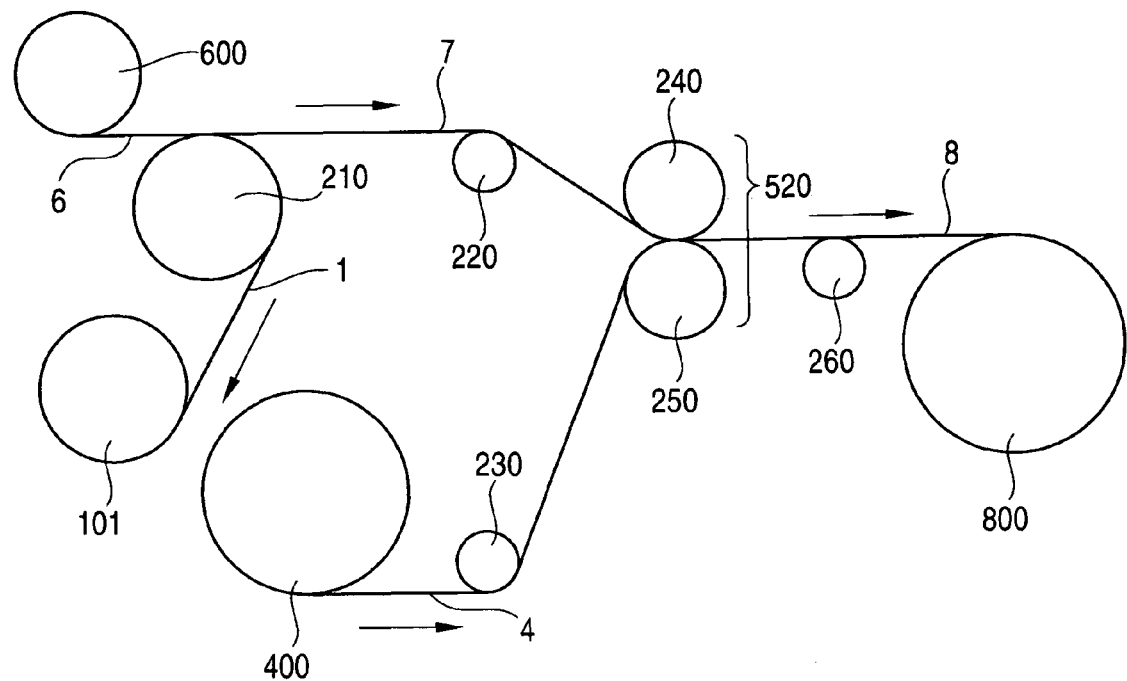
FIG. 2 is a diagrammatic view illustrating a roll-to-roll apparatus for use in producing another embodiment of the conductor-clad laminate of the invention.

FIG. 1 and FIG. 2 are diagrammatic views illustrating examples of roll-to-roll apparatus for use in producing one embodiment of the conductor-clad laminate of the invention.

The roll-to-roll apparatus shown in FIG. 1 is for use in the first half of steps for producing a conductor-clad laminate, and the roll-to-roll apparatus shown in FIG. 2 is for use in the latter half of the steps for producing a conductor-clad laminate.

The roll-to-roll apparatus shown in FIG. 1 includes a roll 100 for a release film; a roll 300 for an insulating film; conveying rollers 110, 120, 130 and 160; an adhesive application part 200; a drying oven 500; a laminator 510 and a roll 600 for a layered product.

On the release-film roll 100, a continuous release film 1 including a polyethylene terephthalate film (hereinafter referred to as PET film) is wound. On the insulating-film roll 300, a continuous insulating film 3 including a polyimide film is wound.

The laminator 510 is constituted of a pair of laminating rollers 140 and 150 which rotate in the state of being in contact with each other. A layered product 6 which is described below is rewound on the layered-product roll 600.

The roll-to-roll apparatus shown in FIG. 2 includes a roll 101 for a release film; a roller 210 for stripping; conveying rollers 220, 230 and 260; a roll 400 for a conductor film; a laminator 520; a roll 600 for a layered product and a roll 800 for a conductor-clad laminate.

The laminator 520 is constituted of a pair of laminating rollers 240 and 250 which rotate in the state of being in contact with each other. On the conductor-film roll 400, a continuous conductor film 4 including a copper foil is wound. The roll 600 for a layered-product is the roll 600 in FIG. 1. A conductor-clad laminate 8 which is described below is rewound on the roll 800 for a conductor-clad laminate.

(2) Process for Producing Conductor-Clad Laminate

FIGS. 3A to 3D are sectional views illustrating steps in a process for producing a conductor-clad laminate using the roll-to-roll apparatus shown in FIG. 1 and FIG. 2. The process for producing a conductor-clad laminate according to the invention will be explained below by reference to FIGS. 1 to 3D.

First, as shown in FIG. 1, a release film 1 including a PET film is fed from the roll 100 of the roll-to-roll apparatus. The release film 1 is conveyed to the adhesive application part 200 with the conveying roller 110. At the adhesive application part 200, an adhesive solution is applied to the release film 1. The release film 1 is then conveyed to the drying oven 500 with the conveying roller 120 and passed through the drying oven 500. In the drying oven 500, the adhesive solution on the release film 1 is dried by heating.

Figure 3A:
FIGS. 3A to 3D are sectional views illustrating steps in a process for producing a conductor-clad laminate using the roll-to-roll apparatus shown in FIG. 1 and FIG. 2.

As a result, an adhesive layer 2 is formed on the release film 1 including a PET film, as shown in FIG. 3A. Thus, a layered product 5 including the release film 1 and the adhesive layer 2 is produced.

In this case, when the adhesive solution is dried, the release film 1 is heated in a tensioned state.

The drying temperature in the drying oven 500 is preferably 60° C. or higher in order to sufficiently dry the adhesive solution. From the standpoint of preventing the release film 1 from deforming, the drying temperature in the drying oven 500 is preferably 150° C. or lower. It is therefore preferable that the drying temperature in the drying oven 500 be in the range of from 60 to 150° C. It is preferable to use an acrylic adhesive as the adhesive.

The layered product 5 passed through the drying oven 500 shown in FIG. 1 is conveyed to the laminator 510 with the conveying roller 130. On the other hand, an insulating film 3 including a polyimide film is fed from the roll 300. The insulating film 3 is conveyed to the laminator 510 with the conveying roller 160.

In the laminator 510, the layered product 5 and the insulating film 3 are passed through the pair of laminating rollers 140 and 150, whereby the insulating film 3 is laminated on the layered product 5. The temperature for this laminating is room temperature (about 25° C.).

Figure 3B:
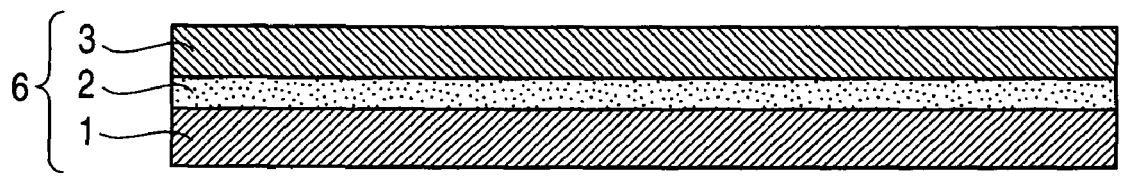

As a result, as shown in FIG. 3B, the insulating film 3 including a polyimide film is superposed through the adhesive layer 2 on the release film 1 including a PET film. Thus, a layered product 6 including the release film 1, adhesive layer 2 and insulating film 3 is produced. This layered product 6 is wound on the roll 600 shown in FIG. 1.

In this case, since the release film 1 is cooled in a tensioned state, it comes to have a residual stress therein. In contrast, since the insulating film 3 is laminated on the adhesive layer 2 at room temperature, the insulating film 3 has almost no residual stress therein.

Next, as shown in FIG. 2, the layered product 6 shown in FIG. 3B is fed from the roll 600 of the roll-to-roll apparatus. The release film 1 of the layered product 6 is rewound on the roll 101 through the stripping roller 210, whereby the release film 1 is stripped from the layered product 6.

Figure 3C:
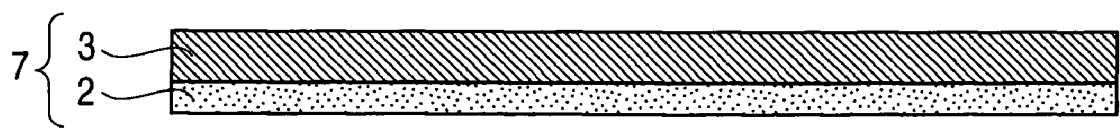

As a result, a layered product 7 including the adhesive layer 2 and the insulating film 3 is produced as shown in FIG. 3C.

The layered product 7 from which the release film 1 is stripped is then conveyed to the laminator 520 with the conveying roller 220 shown in FIG. 2. On the other hand, a conductor film 4 including a copper foil is fed from the roll 400. The conductor film 4 is conveyed to the laminator 520 with the conveying roller 230.

In the laminator 520, the layered product 7 and the conductor film 4 are passed through the pair of laminating rollers 240 and 250, whereby the conductor film 4 is laminated to the layered product 7. The temperature for this laminating of the conductor film 4 is preferably in the range of from 50 to 120° C.

Figure 3D:
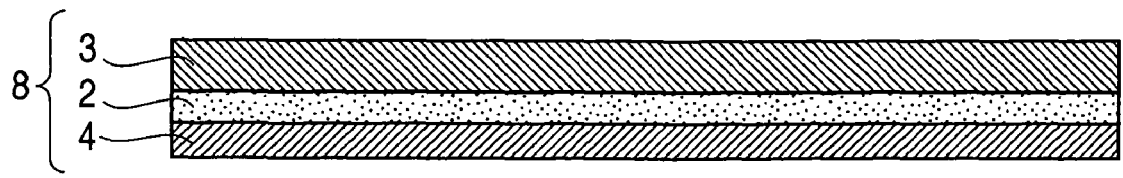

As a result, as shown in FIG. 3D, the conductor film 4 including a copper foil is superposed through the adhesive layer 2 on the insulating film 3 including a polyimide film. Thus, a conductor-clad laminate 8 including the insulating film 3, adhesive layer 2 and conductor film 4 is produced.

The conductor-clad laminate 8 is conveyed with the conveying roller 260 shown in FIG. 2 and rewound on the roll 800.

(3) Process for Producing Wiring Circuit Board

Subsequently, a process for producing a wiring circuit board from the conductor-clad laminate 8 is explained. The subtractive method is used herein as an example.

FIGS. 4A to 4D are sectional views illustrating steps in a process for producing a wiring circuit board from the conductor-clad laminate 8.

Figure 4A:
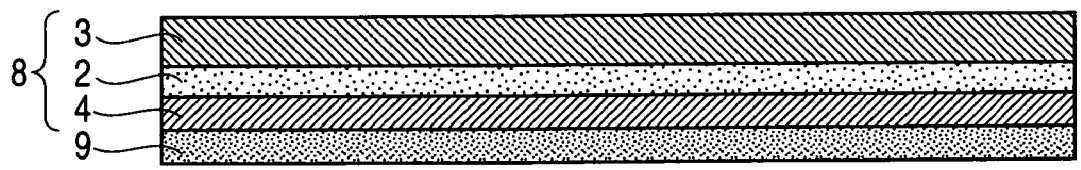
FIGS. 4A to 4D are sectional views illustrating steps in a process for producing a wiring circuit board from a conductor-clad laminate.

First, as shown in FIG. 4A, an etching resist film 9 is formed on the conductor film 4 of the conductor-clad laminate 8. Examples of the etching resist 9 used herein include a dry film resist.

Figure 4B:
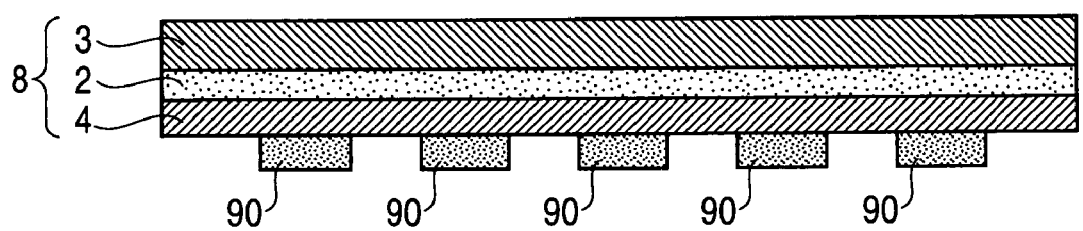

Subsequently, the etching resist 9 is patterned into a given shape through exposure to light and development to thereby form a resist pattern 90 as shown in FIG. 4B.

Figure 4C:
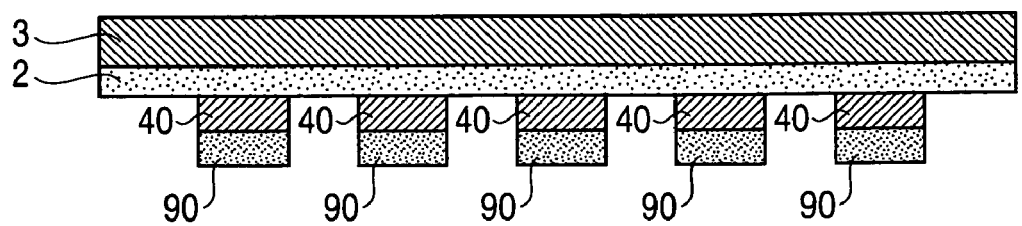

Furthermore, as shown in FIG. 4C, those areas of the conductor film 4 which do not underlie the resist pattern 90 are removed by etching. As a result, a conductor pattern 40 is formed.

Figure 4D:
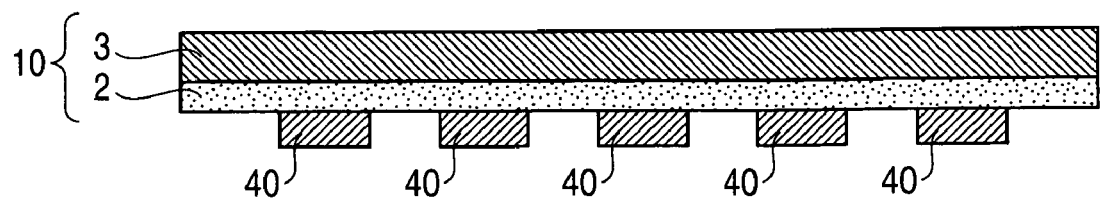

Finally, the resist pattern 90 is removed with a remover liquid as shown in FIG. 4D. Thus, a wiring circuit board 10 including the insulating film 3 and the conductor pattern 40 formed thereon through the adhesive layer 2 is produced. Herein, the conductor pattern 40 corresponds to a wiring pattern.

(4) Advantages of This Embodiment

As shown above, according to the process for producing a conductor-clad laminate 8 according to the invention, an adhesive layer 2 is formed on a release film 1 by heating an adhesive solution and an insulating film 3 is then laminated on the adhesive layer 2. Thereafter, the release film 1 is stripped off and a conductor film 4 is laminated on the adhesive layer 2. Therefore, although the release film 1 stripped has a residual stress therein, the insulating film 3 has almost no residual stress therein. Consequently, when the conductor film 4 of the conductor-clad laminate 8 is patterned, the insulating film 3 is inhibited from being dimensionally changed by residual-stress release.

Furthermore, since the insulating film 3 of the conductor-clad laminate 8 is inhibited from changing dimensionally, the wiring circuit board has improved dimensional accuracy.

(5) Other Embodiments

The material of the release film 1 is not limited to a PET film, and other materials such as other resins and paper may be used.

The material of the insulating film 3 is not limited to a polyimide film, and other insulating materials such as PET films, poly(ether-nitrile) films and polyethersulfone films may be used.

The material of the conductor film 4 is not limited to a copper foil, and other metal foils such as foils of a copper alloy, gold and aluminum may be used.

The material of the adhesive layer 2 is not limited to an acrylic adhesive, and use may be made of epoxy adhesives, polyimide adhesives, and the like.

(6) Correspondence of Constituent Elements in the Invention to Parts in the Embodiment The layered product 5, layered product 6 and layered product 7 in the embodiment described above correspond to the first layered product, second layered product and third layered product, respectively.

EXAMPLE (1) Example

In Example, a conductor-clad laminate 8 was produced by the process of the embodiment described above by reference to FIGS. 1, 2 and 3A to 3D.

As a release film 1, a PET film having a thickness of 50 μm was used. As an insulating film 3, a polyimide film having a thickness of 12.5 μm which was Upilex Type NPI, manufactured by Du Pont-Toray Co., Ltd., was used. As a conductor film 4, a copper foil having a thickness of 18 μm was used.

Using the roll-to-roll apparatus shown in FIG. 1, an adhesive solution was applied to the release film 1 including the PET film and the release film 1 was then passed through the drying oven 500 regulated to 80° C. to thereby form an adhesive layer 2. Subsequently, the insulating film 3 including the polyimide film was laminated on the adhesive layer 2 at room temperature (about 25° C.) to thereby produce a layered product 6 composed of the release film 1 including the PET film, the adhesive layer 2 and the insulating film 3 including the polyimide film. The layered product 6 was temporarily wound to obtain a roll 600.

Subsequently, the roll-to-roll apparatus shown in FIG. 2 was used to strip the release film 1 including the PET film from the layered product 6 and to laminate the conductor film 4 including the copper foil on the adhesive layer 2. Thus, a conductor-clad laminate 8 (copper-clad laminate) was produced.

(2) Comparative Example

In Comparative Example, a conductor-clad laminate was produced by the following production process. The materials and thicknesses of the release film 1, insulating film 3 and conductor film 4 are the same as in Example.

The process for producing a conductor-clad laminate in Comparative Example differs from that in Example in the following point. In Example, an adhesive layer 2 was formed on a release film 1 and an insulating film 3 was then laminated to the adhesive layer 2 to produce a layered product 6. In contrast, in Comparative Example, an adhesive layer 2 was formed on an insulating film 3 and a release film 1 was then laminated to the adhesive layer 2 to produce a layered product.

Figure 5:
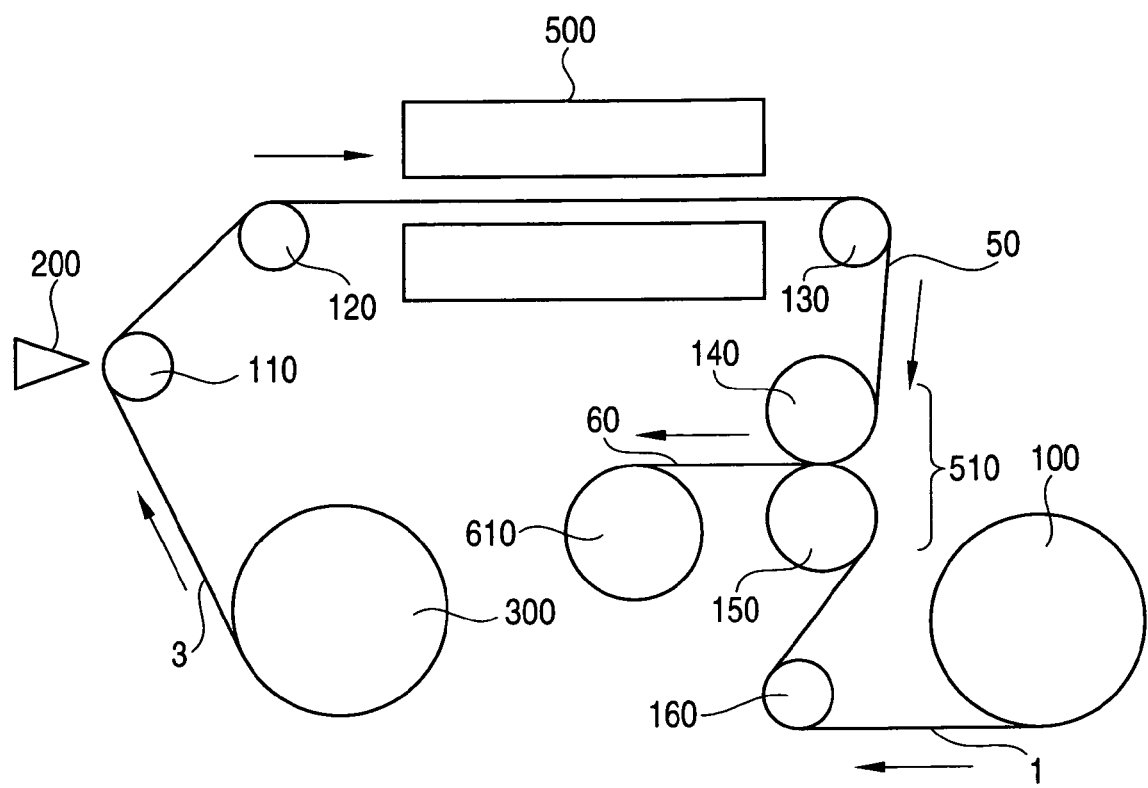
FIG. 5 is a diagrammatic view of a roll-to-roll apparatus used in the process of Comparative Example for producing a conductor-clad laminate.

The process for producing a conductor-clad laminate in Comparative Example is explained below. FIG. 5 is a diagrammatic view of the roll-to-roll apparatus used in the process of Comparative Example for producing a conductor-clad laminate. FIGS. 6A to 6D are sectional views illustrating steps in the process of Comparative Example for producing a conductor-clad laminate.

First, as shown in FIG. 5, an insulating film 3 including a polyimide film is fed from a roll 300 of the roll-to-roll apparatus. The insulating film 3 is conveyed to an adhesive application part 200 with a conveying roller 110. At the adhesive application part 200, an adhesive solution is applied to the insulating film 3. Furthermore, the insulating film 3 is conveyed to a drying oven 500 with a conveying roller 120 and passed through the drying oven 500 regulated to 80° C. In this drying oven 500, the adhesive solution on the insulating film 3 is dried by heating.

Figure 6A:
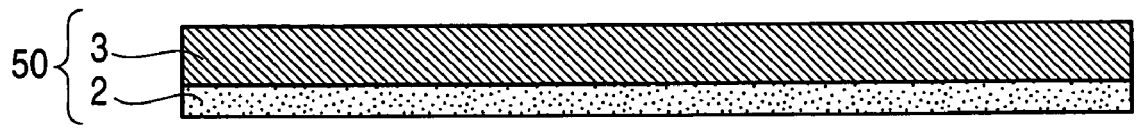
FIGS. 6A to 6D are sectional views illustrating steps in the process of Comparative Example for producing a conductor-clad laminate.

As a result, as shown in FIG. 6A, an adhesive layer 2 is formed on the insulating film 3 including a polyimide film. Thus, a layered product 50 including the insulating film 3 and the adhesive layer 2 is produced.

In this case, when the adhesive solution is dried, the insulating film 3 is heated in a tensioned state.

The layered product 50 which is passed through the drying oven 500 shown in FIG. 5 is conveyed to a laminator 510 with a conveying roller 130. On the other hand, a release film 1 including a PET film is fed from a roll 100. The release film 1 is conveyed to the laminator 510 with a conveying roller 160.

In the laminator 510, the layered product 50 and the release film 1 are passed through a pair of laminating rolls 140 and 150, whereby the release film 1 is laminated on the layered product 50. The temperature for this laminating is room temperature (about 25° C.).

Figure 6B:
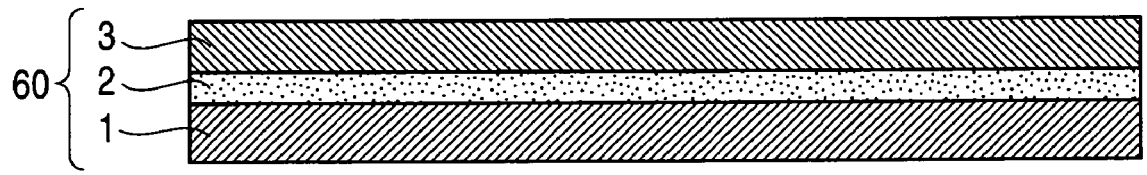

As a result, as shown in FIG. 6B, the release film 1 including a PET film is superposed through the adhesive layer 2 on the insulating film 3 including a polyimide film. Thus, a layered product 60 including the release film 1, adhesive layer 2 and insulating film 3 is produced. This layered product 60 is rewound on a roll 610 shown in FIG. 5.

In this case, since the insulating film 3 is cooled in a tensioned state, it comes to have a residual stress therein.

Figure 6C:
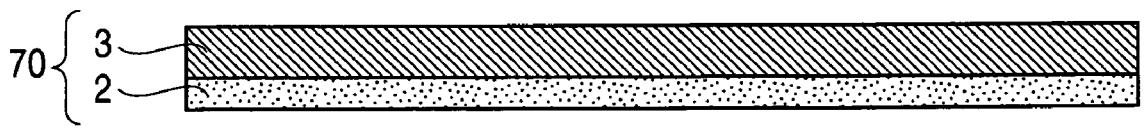
Figure 6D:
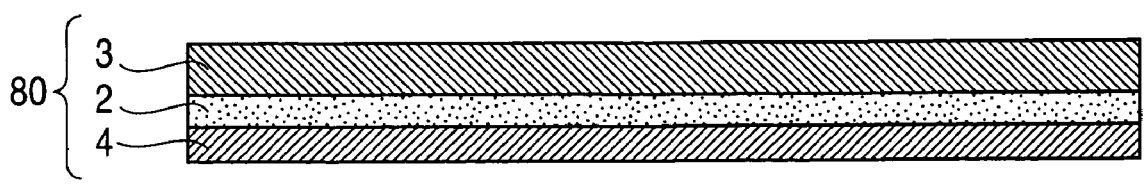

Subsequently, as shown in FIG. 6C, the roll-to-roll apparatus shown in FIG. 2 is used to strip the release film 1 from the layered product 60 to produce a layered product 70 including the adhesive layer 2 and the insulating film 3. Thereafter, as shown in FIG. 6D, a conductor film 4 is laminated on the layered product 70 and a conductor film 4 is formed on the insulating film 3 through the adhesive layer 2. Thus, a conductor-clad laminate 80 (copper-clad laminate) including the insulating film 3, adhesive layer 2 and conductor film 4 is formed.

(3) Evaluation of Example and Comparative Example

(3-1) Measurement of Degree of Dimensional Change Through Etching

Figure 7:
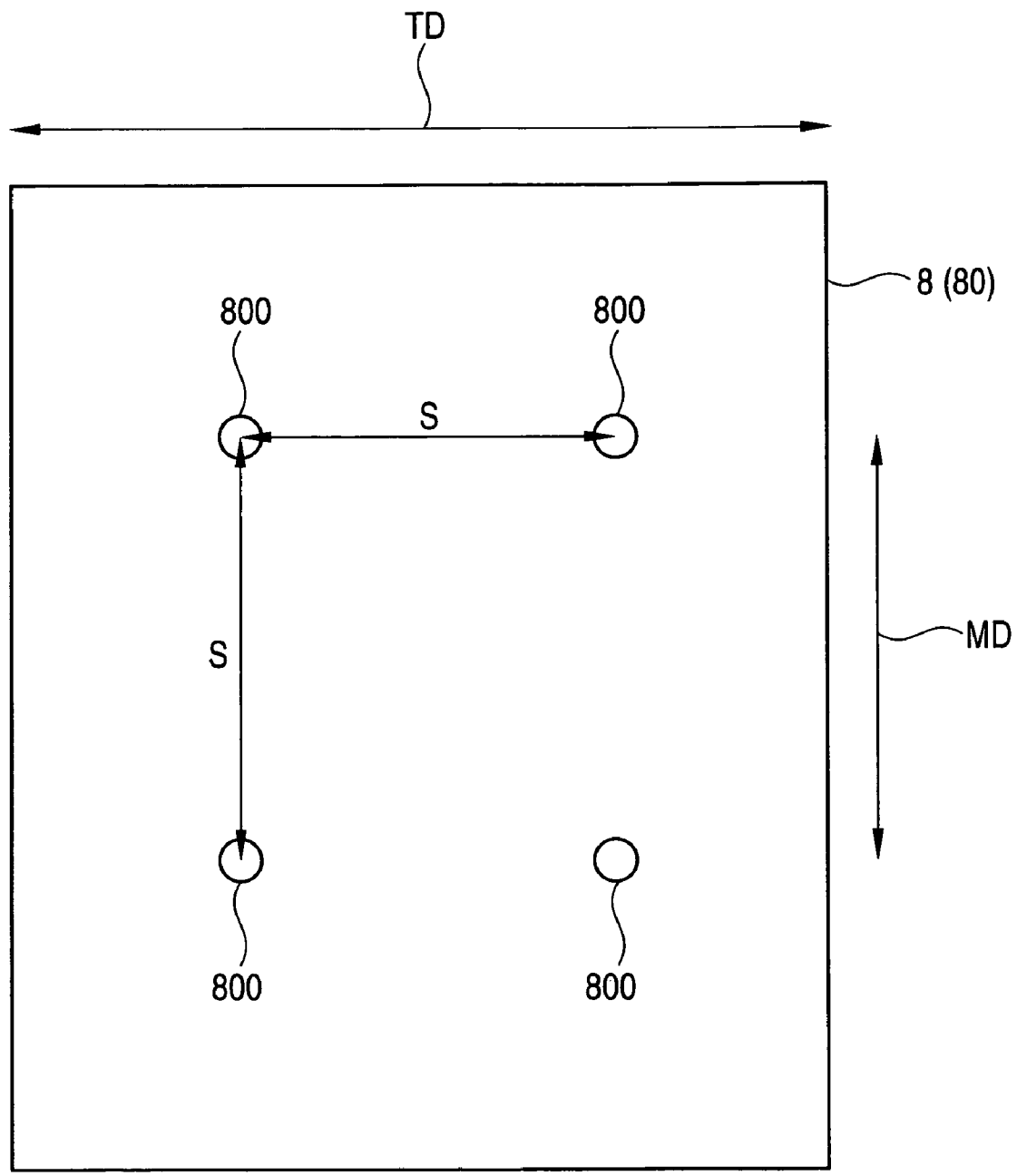
FIG. 7 is a view illustrating a method of measuring the degree of dimensional change in Example and Comparative Example.

The conductor-clad laminates 8 and 80 produced in Example and Comparative Example were cut into sheets. As shown in FIG. 7, holes 800 were formed in square lattice arrangement in each of the conductor-clad laminates 8 and 80 by drilling.

In FIG. 7, MD indicates the machine direction of the conductor-clad laminate 8 or 80 in the roll-to-roll steps, and TD indicates the transverse direction for the conductor-clad laminate 8 or 80. The diameter of each hole 800 is 100 μm. The distance S between the centers of adjacent holes 800 is about 50 mm with respect to each of the machine direction MD and the transverse direction TD.

The conductor-clad laminate 8 or 80 was allowed to stand for 24 hours under the conditions of a temperature of 25° C. and a humidity of 45%. Thereafter, the distance S0 between the centers of holes 800 (hereinafter referred to as distance S0 between holes 800 after standing) was measured.

Thereafter, the conductor film 4 including a copper foil was wholly removed by etching. The conductor-clad laminate 8 or 80 was then allowed to stand for 24 hours under the conditions of a temperature of 25° C. and a humidity of 45%. Thereafter, the distance S1 between the centers of holes 800 (hereinafter referred to as distance S1 between holes 800 after etching) was measured. The number of sheets thus examined was 36 with respect to each of the conductor-clad laminates 8 and 80.

The degree of dimensional change R1 of the insulating film 3 through the etching was calculated from the distance S0 between holes 800 after standing and the distance S1 between holes 800 after etching using the following equation.

$$R1(\%) = ((S1-S0)/S0) \times 100$$

(3-2) Measurement of Degree of Dimensional Change Through Heat Treatment

Each of the conductor-clad laminates 8 and 80 was examined for the distance S0 between holes 800 after standing in the same manner as described above. Thereafter, the conductor-clad laminate 8 or 80 was heat-treated at 150° C. for 1 hour using a drying oven and then allowed to stand for 24 hours under the conditions of a temperature of 25° C. and a humidity of 45%. Thereafter, the distance S2 between the centers of holes 800 (hereinafter referred to as distance S2 between holes 800 after heat treatment) was measured. The number of sheets thus examined was 36 with respect to each of the conductor-clad laminates 8 and 80.

The degree of dimensional change R2 of the conductor-clad laminate 8 or 80 through the heat treatment was calculated from the distance S0 between holes 800 after standing and the distance S2 between holes 800 after heat treatment using the following equation.

$$R2(\%) = ((S2-S0)/S0) \times 100$$

(3-3) Evaluation Results

The results of the calculations of the degree of dimensional change R1 of the insulating film 3 through the etching and the degree of dimensional change R2 of the conductor-clad laminate 8 or 80 through the heat treatment in Example and Comparative Example are shown in Table 1.

TABLE 1

| | Degree of Dimensional Change [%] | | | |
| --- | --- | --- | --- | --- |
| | R1 (through etching) | | R2 (through heat treatment) | |
| | TD | MD | TD | MD |
| Example | −0.016 (0.009) | −0.088 (0.008) | −0.034 (0.015) | −0.165 (0.014) |
| Comparative Example | 0.069 (0.028) | −0.134 (0.018) | 0.074 (0.034) | −0.167 (0.022) |

In Table 1, the numeral in each parenthesis indicates standard deviation σ.

As shown in Table 1, the degree of dimensional change R1 of the insulating film 3 through etching in Example was significantly lower than the degree of dimensional change R1 of the insulating film 3 through etching in Comparative Example with respect to each of the machine direction MD and transverse direction TD.

Furthermore, the degree of dimensional change R2 of the conductor-clad laminate 8 through heat treatment in Example was significantly lower than the degree of dimensional change R2 of the conductor-clad laminate 80 through heat treatment in Comparative Example in each of the machine direction MD and transverse direction TD.

It is thought from those results that in the case of Example, in which an adhesive layer 2 is formed on a release film 1 and an insulating film 3 is then laminated to the adhesive layer 2 to thereby produce a layered product 6, the insulating film 3 has almost no residual stress therein in comparison with the case of Comparative Example, in which an adhesive layer 2 is formed on an insulating film 3 and a release film 1 is then laminated to the adhesive layer 2 to thereby produce a layered product. As a result, the conductor-clad laminate 8 has a considerably reduced degree of dimensional change.

While the present invention has been described in detail and with reference to specific embodiments thereof, it will be apparent to one skilled in the art that various changes and modifications can be made therein without departing from the scope thereof.

This application is based on Japanese patent application No. 2005-337993 filed Nov. 24, 2005, the entire contents thereof being hereby incorporated by reference.

What is claimed is:

1. A process for producing a conductor-clad laminate, which comprises:

applying an adhesive solution to a release film in a continuous form while conveying said release film in a continuous form and drying the adhesive solution by heating while conveying said release film in a continuous form to which the adhesive solution has been applied, to thereby form an adhesive layer on said release film in a continuous form and produce a first layered product in a continuous form;

laminating an insulating film on the adhesive layer of the first layered product to thereby produce a second layered product comprising the insulating film, the adhesive layer and the release film;

removing the release film from the second layered product to thereby produce a third layered product comprising the insulating film and the adhesive layer; and laminating a conductor film on the adhesive layer of the third layered product.

2. The process for producing a conductor-clad laminate of claim 1, said step of producing the second layered product comprising:

laminating said insulating film in a continuous form on the adhesive layer of said first layered product in a continuous form while conveying said first layered product and conveying said insulating film in a continuous form, to thereby produce said second layered product in a continuous form, which comprises said insulating film in a continuous form, the adhesive layer and said release film in a continuous form.

3. The process for producing a conductor-clad laminate of claim 2, said step of producing the third layered product comprising:

removing said release film in a continuous form from said second layered product in a continuous form while conveying said second layered product, to thereby produce said third layered product in a continuous form, which comprises said insulating film in a continuous form and the adhesive layer.

4. The process for producing a conductor-clad laminate of claim 3, said step of laminating the conductor film on the adhesive layer comprising:

laminating said conductor film in a continuous form on the adhesive layer of said third layered product in a continuous form while conveying said third layered product.

5. The process for producing a conductor-clad laminate according to claim 1, wherein the insulating film comprises a polyimide.

6. The process for producing a conductor-clad laminate according to claim 1, wherein the release film comprises polyethylene terephthalate.

7. The process for producing a conductor-clad laminate according to claim 1, wherein the adhesive layer comprises an acrylic adhesive.

8. The process for producing a conductor-clad laminate according to claim 1, wherein the conductor film comprises a copper foil.

9. A process for producing a wiring circuit board, which comprises:

producing a conductor-clad laminate by the process according to claim 1; and etching the conductor film of the conductor-clad laminate to thereby form a wiring pattern.

\* \* \* \* \*